United States Patent
Lee (10) Patent No.: US 11,688,706 B2
(45) Date of Patent: Jun. 27, 2023

(54) SEMICONDUCTOR DEVICE ASSEMBLY WITH EMBOSSED SOLDER MASK HAVING NON-PLANAR FEATURES AND ASSOCIATED METHODS AND SYSTEMS

(71) Applicant: Micron Technology, Inc., Boise, ID (US)

(72) Inventor: Jungbae Lee, Taichung (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/021,364

(22) Filed: Sep. 15, 2020

(65) Prior Publication Data

US 2022/0084971 A1 Mar. 17, 2022

(51) Int. Cl.
*H01L 23/31* (2006.01)
*H01L 23/00* (2006.01)
*H01L 21/60* (2006.01)

(52) U.S. Cl.
CPC .......... *H01L 24/13* (2013.01); *H01L 23/3178* (2013.01); *H01L 24/05* (2013.01); *H01L 24/81* (2013.01); *H01L 2021/60022* (2013.01); *H01L 2224/13147* (2013.01); *H01L 2224/81801* (2013.01)

(58) Field of Classification Search
CPC ......... H01L 24/05; H01L 24/13; H01L 24/81; H01L 23/3178; H01L 21/565; H01L 21/566; H01L 24/11; H01L 23/3278; H01L 2224/13147; H01L 2224/81801; H01L 23/3142; H01L 2224/83385; H01L 2224/16238; H01L 2924/18301; H01L 2924/35121; H01L 2021/60022

USPC .......................................................... 257/737
See application file for complete search history.

(56) References Cited

U.S. PATENT DOCUMENTS

| | | | |
|---|---|---|---|
| 6,320,127 B1 * | 11/2001 | Nagarajan | H01L 21/563 174/557 |
| 9,520,349 B2 * | 12/2016 | Hsu | H01L 24/26 |
| 9,609,752 B1 * | 3/2017 | Blass | H05K 3/243 |
| 2003/0234447 A1 * | 12/2003 | Yunus | H05K 1/111 257/739 |
| 2007/0259517 A1 * | 11/2007 | Benson | H01L 31/02161 438/618 |
| 2009/0293269 A1 * | 12/2009 | Dai | H01L 21/563 29/829 |

(Continued)

*Primary Examiner* — Khiem D Nguyen
(74) *Attorney, Agent, or Firm* — Perkins Coie LLP (57) ABSTRACT

Embossed solder masks for a semiconductor device assembly, and associated methods and systems are disclosed. In one embodiment, a package substrate includes the solder mask with non-planar features along a surface of the solder mask such that the area of the surface is increased. The non-planar features may correspond to concave recesses formed on the surface of the solder mask. Physical dimensions (e.g., widths, depths) and/or areal densities of the non-planar features of the embossed solder masks may vary based on local areas of the package substrate exclusive of conductive bumps. The non-planar features may be formed by pressing a mold having convex features against the surface of the solder mask. The solder mask may be heated while pressing the mold against the surface of the solder mask. In some embodiments, the mold includes regions lacking the convex features.

20 Claims, 7 Drawing Sheets

(56) References Cited

U.S. PATENT DOCUMENTS

| | | | |
|---|---|---|---|
| 2012/0146199 A1* | 6/2012 | McMillan | H01L 23/49861 257/666 |
| 2013/0062786 A1* | 3/2013 | Leung | H01L 23/49894 257/782 |
| 2013/0334291 A1* | 12/2013 | Eom | H01L 24/13 228/141.1 |
| 2014/0346673 A1* | 11/2014 | Lin | H01L 21/563 257/737 |
| 2015/0001733 A1* | 1/2015 | Karhade | H01L 23/5386 257/782 |
| 2015/0137349 A1* | 5/2015 | Chen | H01L 24/05 257/737 |
| 2017/0133306 A1* | 5/2017 | Wu | H01L 21/4853 |
| 2017/0347455 A1* | 11/2017 | Watanabe | H05K 1/113 |
| 2019/0311918 A1* | 10/2019 | Luo | H01L 24/29 |
| 2020/0135602 A1* | 4/2020 | Zhang | H01L 23/538 |
| 2020/0373252 A1* | 11/2020 | Street | H01L 24/73 |

\* cited by examiner

SEMICONDUCTOR DEVICE ASSEMBLY WITH EMBOSSED SOLDER MASK HAVING NON-PLANAR FEATURES AND ASSOCIATED METHODS AND SYSTEMS

TECHNICAL FIELD

The present disclosure generally relates to semiconductor device assemblies, and more particularly relates to embossed solder masks for semiconductor device assemblies.

BACKGROUND

Semiconductor packages typically include a semiconductor die (e.g., memory chip, microprocessor chip, imager chip) mounted on a substrate and encased in a protective covering. The semiconductor die may include functional features, such as memory cells, processor circuits, or imager devices, as well as bond pads electrically connected to the functional features. The bond pads can be electrically connected to corresponding conductive structures of the substrate, which may be coupled to terminals outside the protective covering such that the semiconductor die can be connected to higher level circuitry.

Market pressures continually drive semiconductor manufacturers to reduce the size of semiconductor packages to fit within the space constraints of electronic devices. In some semiconductor packages, direct chip attach methods (e.g., flip-chip bonding between the semiconductor die and the substrate) may be used to reduce the footprint of the semiconductor packages. Such direct chip attach methods may include directly connecting multiple conductive pillars electrically coupled to the semiconductor die to corresponding conductive structures (e.g., conductive bumps) of the substrate. Further, a solder structure may be formed over individual conductive pillars for bonding the conductive pillars to the corresponding conductive structures—e.g., forming interconnects (which may be referred to as joints) that each include the conductive pillar, the solder structure, and the conductive bump.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Specific details of several embodiments directed to embossed solder masks for semiconductor device assemblies, and associated systems and methods are described below. Some semiconductor dies (e.g., DRAM) include integrated circuitry and bond pads electrically coupled to the integrated circuitry. Further, conductive pillars may be electrically coupled to the bond pads such that the conductive pillars can be directly connected to conductive bumps on a substrate (i.e., package substrate) via a solder structure, thereby forming interconnects—e.g., a direct chip attach (DCA) scheme, a flip-chip bonding scheme, etc. A solder mask may be formed on the substrate to provide electrical isolation among the conductive bumps and/or to protect conductive traces of the substrate (e.g., against oxidation). The interconnects defined by the conductive pillars bonded to the conductive bumps via the solder structure can also mechanically attach the semiconductor die to the substrate. Further, a fill material may be disposed in a space between the semiconductor die and the substrate (and/or the solder mask) to protect the interconnects and to strengthen the attachment between the semiconductor die and the substrate.

In some cases, the conductive pads are distributed in certain designated areas of the semiconductor dies for electrical and/or interface performance of the semiconductor dies—e.g., to provide optimum signal integrity and/or conform to an industry standard (e.g., specifications by the Joint Electron Device Engineering Council (JEDEC)), etc. As a result, there may be regions having a high density of interconnects and other regions without interconnects. In the regions without interconnects, the fill material is the primary component adhering the semiconductor die to the substrate and/or the solder mask. In some cases, mismatches in coefficients of thermal expansion (CTE) between the solder mask and the fill material can induce stresses that overcome the adhesion and result in delamination of the fill material from the solder mask. Further, as a result of delamination defects between the fill material and the solder mask, the interconnects may be subject to additional stress that may cause the solder structure of the interconnect to crack.

The present technology is expected to reduce delamination of the fill material from the solder mask and/or reduce cracks in the interconnects. In some embodiments, the solder mask can include non-planar surface features such that the solder mask has an uneven surface profile. The non-planar features increase the surface area of the solder mask, which increases the strength of the adhesion between the solder mask and the fill material. The non-planar features may also restrict lateral movement between the solder mask and the fill material. The solder mask with the non-planar surface features may be referred to as an embossed solder mask. In some embodiments, the shapes of the non-planar surface features can be based on physical properties (e.g., viscosity, wettability) of various fill materials. Moreover, the dimensions and arrangement of the non-planar surface features (e.g., depths, widths, shapes, and/or areal densities of the non-planar surface features) may be based on various parameters to avoid delamination defects and/or cracks.

The term "semiconductor device or die" generally refers to a solid-state device that includes one or more semiconductor materials. Examples of semiconductor devices include logic devices, memory devices, microprocessors, or diodes, among others. Such semiconductor devices may include integrated circuits or components, data storage elements, processing components, and/or other features manufactured on semiconductor substrates. Further, the term "semiconductor device or die" can refer to a finished device or to an assembly or other structure at various stages of processing before becoming a finished device. Depending upon the context in which it is used, the term "substrate" can refer to a wafer-level substrate or to a singulated, die-level substrate. Also, a substrate may include a semiconductor wafer, a package support substrate, an interposer, a semiconductor device or die, or the like. A person having ordinary skill in the relevant art will recognize that suitable steps of the methods described herein can be performed at the wafer level or at the die level.

Further, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques. Some of the techniques may be combined with photolithography processes. A person skilled in the relevant art will also understand that the technology may have additional embodiments, and that the technology may be practiced without several of the details of the embodiments described herein with reference to FIGS. 2A through 5.

As used herein, the terms "vertical," "lateral," "down," "up," "upper," and "lower" can refer to relative directions or positions of features in the semiconductor device assemblies in view of the orientation shown in the Figures. For example, "upper" or "uppermost" can refer to a feature positioned closer to the top of a page than another feature. These terms, however, should be construed broadly to include semiconductor devices having other orientations.

Figure 1A:
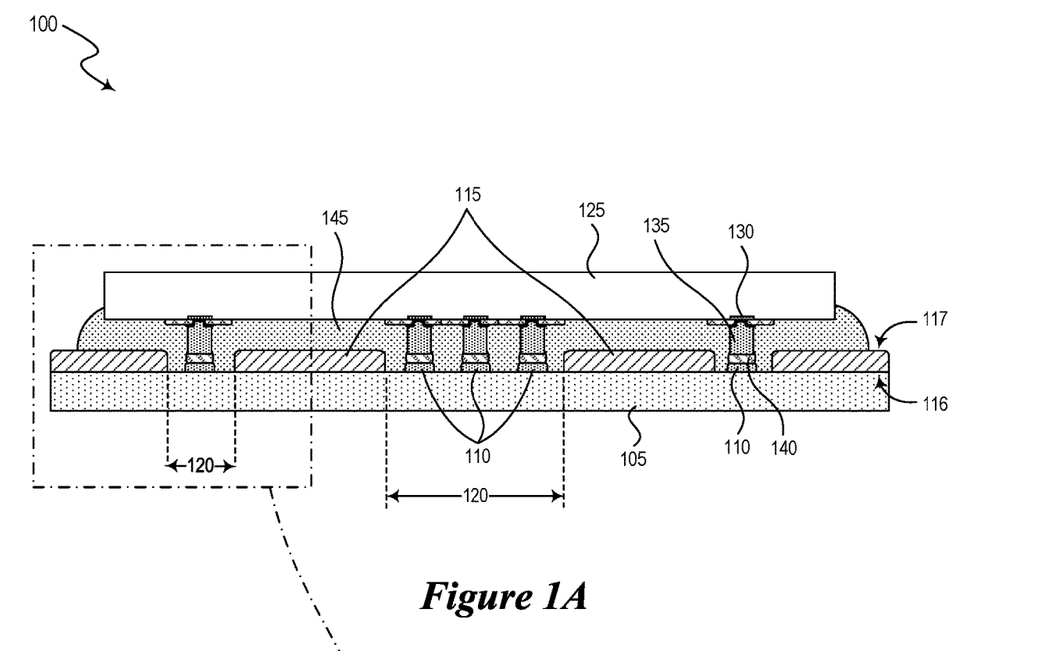
FIG. 1A is a cross-sectional view of a semiconductor device assembly.

FIG. 1A is a cross-sectional view of a semiconductor device assembly 100 having a substrate 105 with conductive bumps 110 and a semiconductor die 125 attached thereto. The semiconductor device assembly 100 includes a solder mask 115 with a first surface 116 attached to the substrate 105, a second surface 117 opposite to the first surface 106, and one or more openings 120 extending between the first surface 116 and the second surface 117 aligned with areas of the substrate 105 where the conductive bumps 110 of the substrate 105 are located. The semiconductor die 125 includes conductive pads 130 (e.g., bond pads) on which conductive pillars 135 are formed. The conductive pillars 135 electrically couple the conductive pads 130 to the conductive bumps 110 through solder connectors 140 such that the semiconductor die 125 is electrically coupled to circuitry in the substrate 105. In some embodiments, the conductive pillars 135 and the conductive bumps 110 include copper, and the solder connectors 140 includes a conductive bond material comprising solder (e.g., TiN based alloy). The semiconductor device assembly 100 also includes a fill material 145 between the semiconductor die 125 and the substrate 105. The semiconductor die 125 may be regarded as "flipped" in that an active surface including various functional features of the semiconductor die 125 faces the substrate 105 and/or the second surface 117 of the solder mask 115.

Figure 1B:
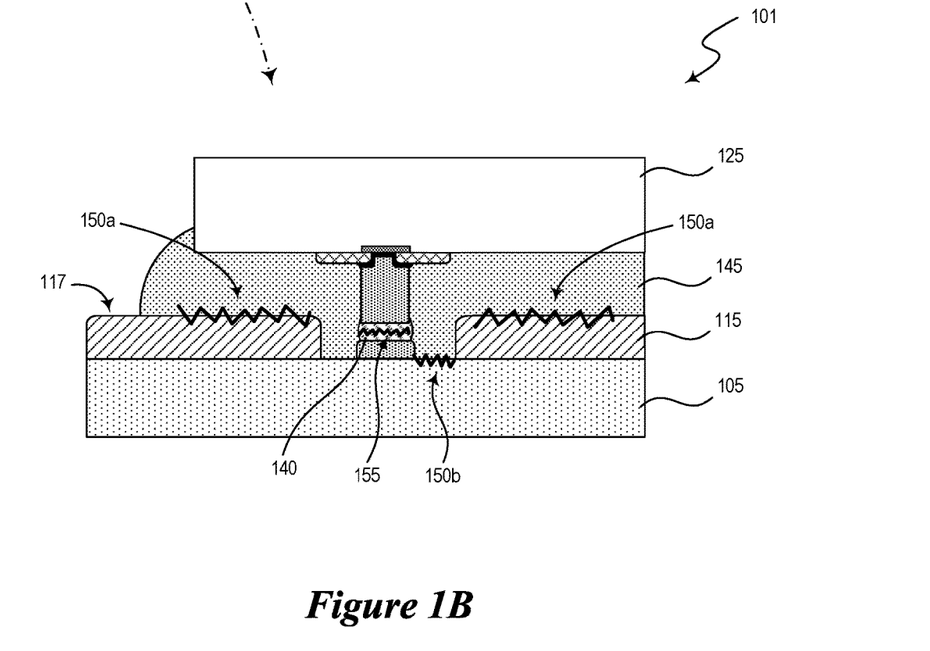
FIG. 1B is a detailed view of a portion of the semiconductor device assembly of FIG. 1A as noted.

FIG. 1B is a detailed view of a portion 101 of the semiconductor device assembly 100 shown in FIG. 1A. As explained above, mechanical stresses induced by differences in the coefficients of thermal expansion (CTEs) of the materials can cause delamination areas 150a between the fill material 145 and the second surface 117 of the solder mask 115. For example, when the second surface 117 of the solder mask 115 is flat (i.e., planar), the fill material 145 may separate from the second surface 117 during assembly processing and/or while operating the semiconductor device assembly 100 due to mechanical and/or thermal stresses. In some instances, additional delamination areas 150b occur between the fill material 145 and the substrate 105. Moreover, cracks 155 can also occur in the interconnects, and in particular at the solder connectors 140, due to such mechanical and/or thermal stresses. This can result in reliability issues and even complete failure of such semiconductor device assemblies.

Figure 2A:
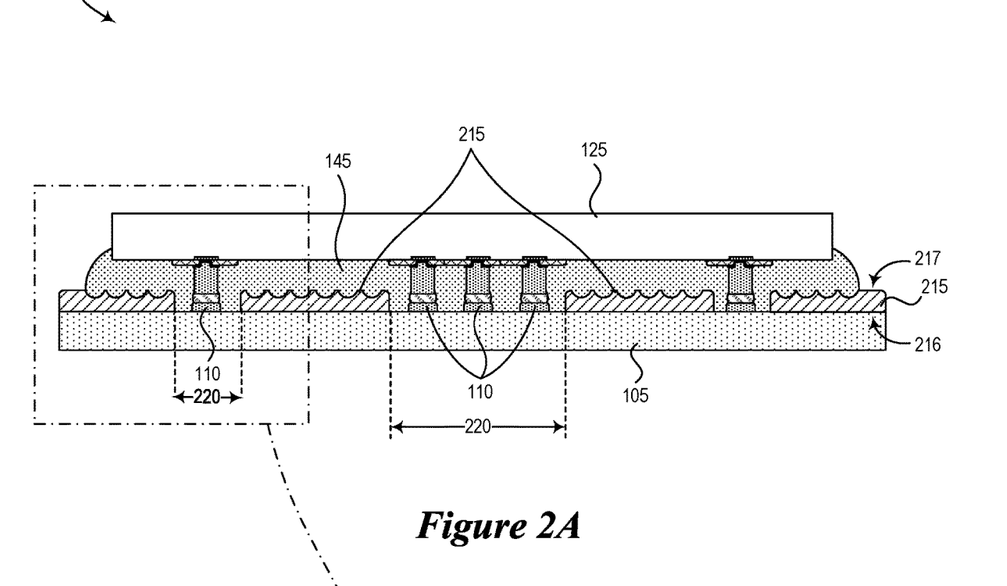
FIG. 2A is a cross-sectional view of a semiconductor device assembly in accordance with an embodiment of the present technology.

FIG. 2A is a cross-sectional view of a semiconductor device assembly 200 in accordance with an embodiment of the present technology that includes a solder mask 215. The semiconductor device assembly 200 includes various components described with reference to FIG. 1, such as the substrate 105, the semiconductor die 125 attached to the substrate 105 through interconnects, and the fill material 145 between the substrate 105 and the semiconductor die 125. The solder mask 215 has a first surface 216 attached to the substrate 105 and a second surface 217 opposite to the first surface 216. Further, the solder mask 215 includes openings 220 extending between the first surface 216 and the second surface 217 in areas with the conductive bumps 110.

Figure 2B:
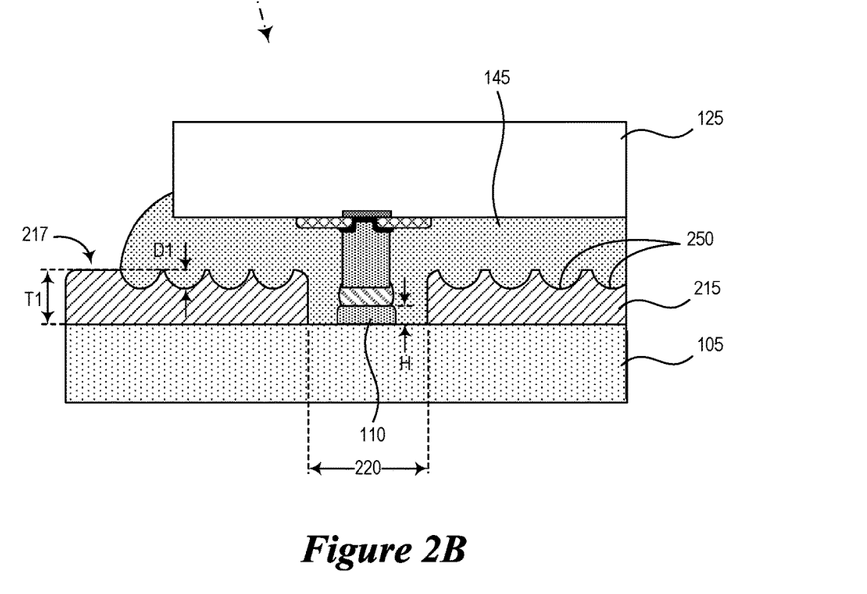
FIG. 2B is a detailed view of a portion of the semiconductor device assembly of FIG. 2A as noted.

FIG. 2B is a detailed view of a portion of the semiconductor device assembly 200 of FIG. 2A as outlined by a dashed box. The second surface 217 of the solder mask 215 has non-planar features 250 such that the second surface 217 has an uneven surface profile corresponding to a contour of the non-planar features 250. The non-planar features 250 may be referred to as non-planar surface features.

In some embodiments, the non-planar features 250 may be concave recesses in the second surface 217 of the solder mask 215. For example, the non-planar features 250 can be scallop-shaped depressions, square-shaped depressions (e.g., castellations), or other shapes. In some embodiments, as depicted in FIG. 2B, a depth D1 of the concave recesses may be less than a difference between a thickness T1 of the solder mask 215 and a height H of the conductive bump 110 above the substrate 105. In some embodiments, the difference may be approximately fifteen (15) micrometers (μm). In some embodiments, the depth D1 may be at least 10%, 20%, or 50% of the difference between the thickness T1 and the height H. As depicted in FIG. 2B, the depth D1 may represent depths of numerous non-planar features 250 (e.g., an average or median depth of non-planar features 250 distributed in a local surface area of the second surface 217). In some embodiments, the non-planar features 250 may be distributed in such a local surface area with uniform areal density (or with non-uniform areal density).

FIG. 2B also illustrates that the fill material 145 may fill the space between the substrate 105 and the semiconductor die 125. In this manner, the fill material 145 fills at least one of the concave recesses and/or contacts the non-planar surface features 250 on the second surface 217 of the solder mask 215. Further, the fill material 145 includes a first portion that fills the uneven surface profile of the second surface 217 and a second portion that is in contact with the semiconductor die 125. The non-planar features 250 increase an area of the second surface 217, thereby increasing the strength of the adhesion between the solder mask 215 and the fill material 145.

Although the foregoing examples of the non-planar features generally have half-circular (or half-elliptical) shapes, the present technology is not limited thereto. For example, the non-planar features may include at least one of dimples, depressions, and/or indentations, V-shaped corrugations, brushed grooves, or a combination thereof. Moreover, the physical dimensions (e.g., widths, depths) of the non-planar features 250 and/or their areal density may vary based on variations in the local adhesion strength necessary to inhibit delamination defects or cracks. For example, in view of local surface areas of the substrate 105 without conductive bumps, the physical dimensions and/or the areal density of the non-planar features 250 may be varied.

In some embodiments, depths of individual concave recesses may not be as uniform as shown in FIGS. 2A and 2B. For example, a first region of the solder mask 215 may include non-planar features 250 with a first depth D1 while a second region of the embossed solder mask 215 may include non-planar features 250 with a second depth different than the first depth D1. In this manner, the second region of the solder mask 215 with non-planar features 250 having the second depth may provide a different adhesion strength than the region with non-planar features having the first depth D1. Such variations in the depths of concave recesses may be based on the first region being more or less susceptible to delamination defects and/or cracks than the second region.

Figure 3A:
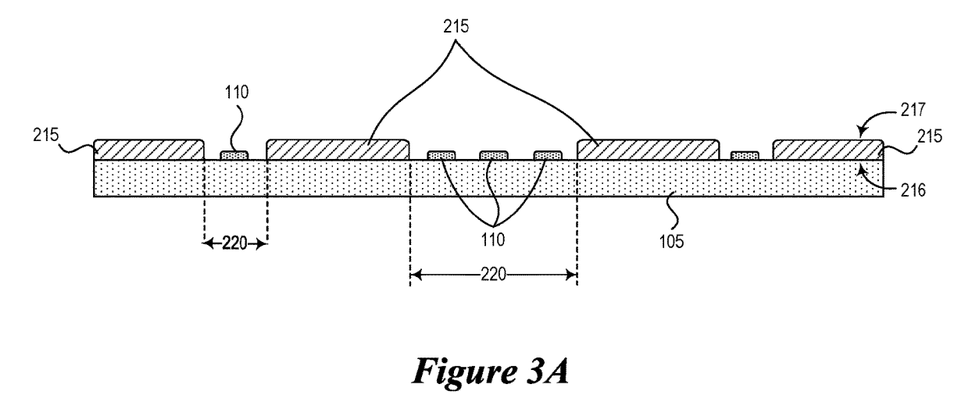
FIGS. 3A through 3E illustrate stages of a process for forming a semiconductor device assembly in accordance with embodiments of the present technology.

FIGS. 3A through 3E illustrate stages of a process for forming a semiconductor device assembly (e.g., the semiconductor device assembly 200) in accordance with embodiments of the present technology. FIG. 3A illustrates the substrate 105 after the material for the solder mask 215 has been deposited on the substrate 105 and openings 220 extending between the first surface 216 and the second surface 217 have been formed in areas with the conductive bumps 110. The first surface 216 of the solder mask material 215 is attached to the substrate 105 and the second surface 217 is opposite to the first surface 216. At this stage of the process, the second surface 217 is planar.

Figure 3B:
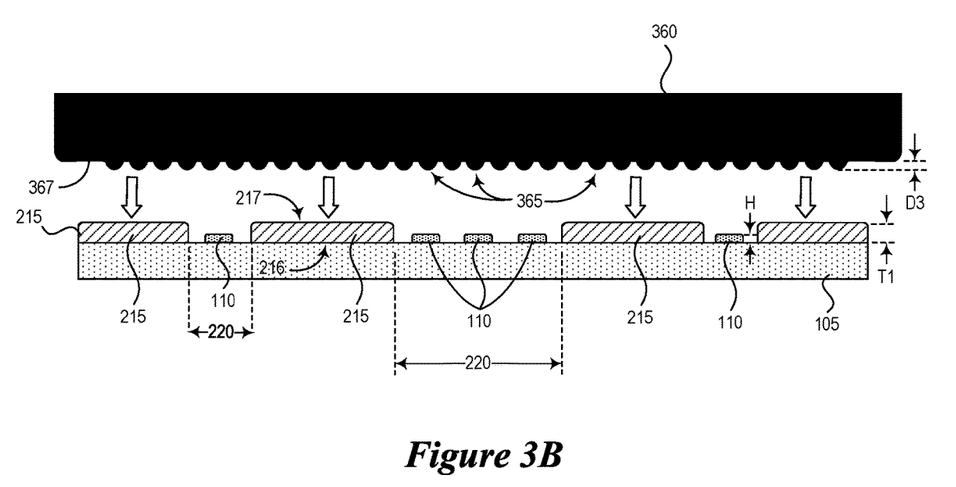

FIG. 3B illustrates one embodiment of forming non-planar surface features on the second surface 217 of the solder mask material 215. In some embodiments, forming the non-planar surface features on the second surface 217 of the solder mask material 215 includes pressing a mold 360 including convex features 365 against the second surface 217 of the solder mask material 215, as indicated by downward arrows, such that the convex features 365 are at least partially inserted into the solder mask material 215. In some embodiments, the solder mask material 215 may be heated to an elevated temperature while pressing the mold 360 against the second surface 217 of the solder mask material 215. Subsequently, the mold 360 is lifted from the second surface 217 of the solder mask material 215.

The convex features 365 form depressions in the solder mask material 215 corresponding to shape and size of the convex features 365 such that the solder mask material 215 is shaped into an embossed solder mask 215. The distance D3 that the convex features 365 protrude from the face 367 of the mold 360 is less than the difference between the thickness T1 of the solder mask 215 and the height H of the conductive bumps 110 above the substrate 105. As such, the convex features 365 can extend across the surface of the mold 360 as the convex features 365 positioned above the conductive bumps 110 do not reach the conductive bumps 110. In some embodiments, the distance D3 corresponds to the depth D1 of the non-planar features 250.

Figure 3C:
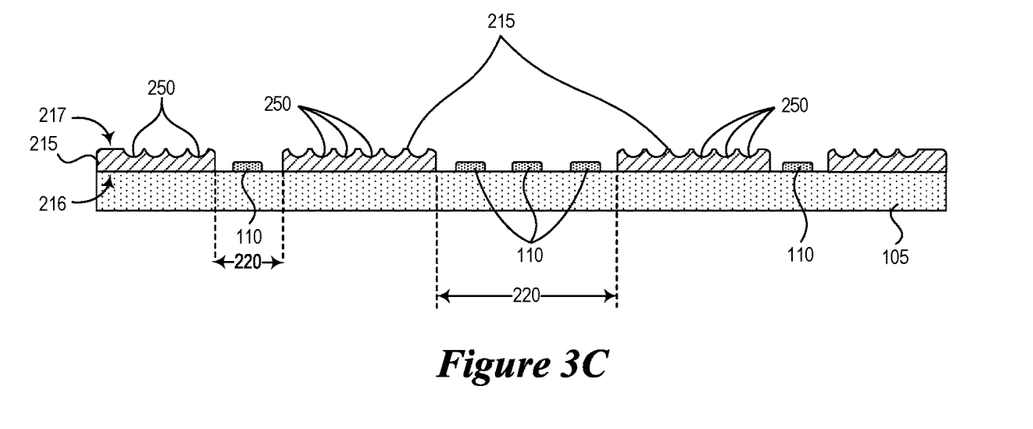

FIG. 3C illustrates the solder mask 215 after the convex features 365 have been pressed into the second surface 217 to form the non-planar features 250. As such, the non-planar surface features 250 correspond to the pattern and shape/size of the convex features 365 of the mold 360. The second surface 217 of the solder mask 215 accordingly has an uneven surface profile. As described above, the physical dimensions and/or the areal density of the non-planar features 250 may be varied in view of local surface areas of the substrate 105 without conductive bumps. As such, the bottom of each of the non-planar features 250 (and corresponding distances D3 of the convex features 365) may not be aligned to (confined to, lying within) a single plane.

Figure 3D:
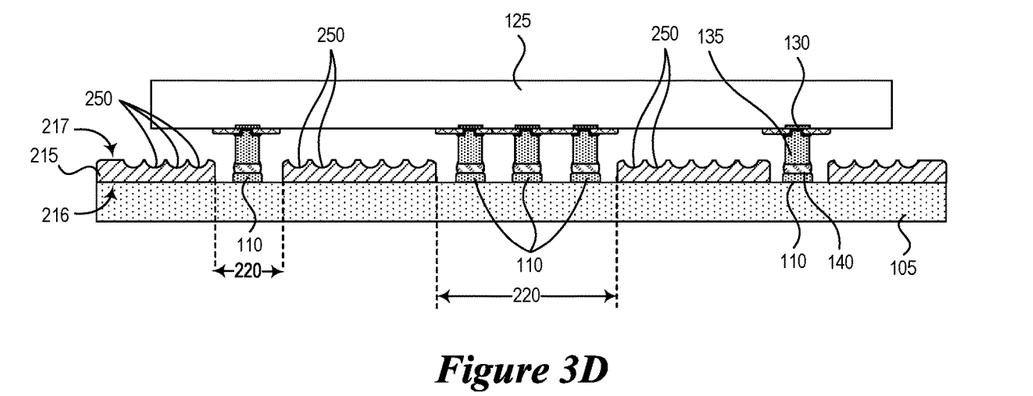
Figure 3E:
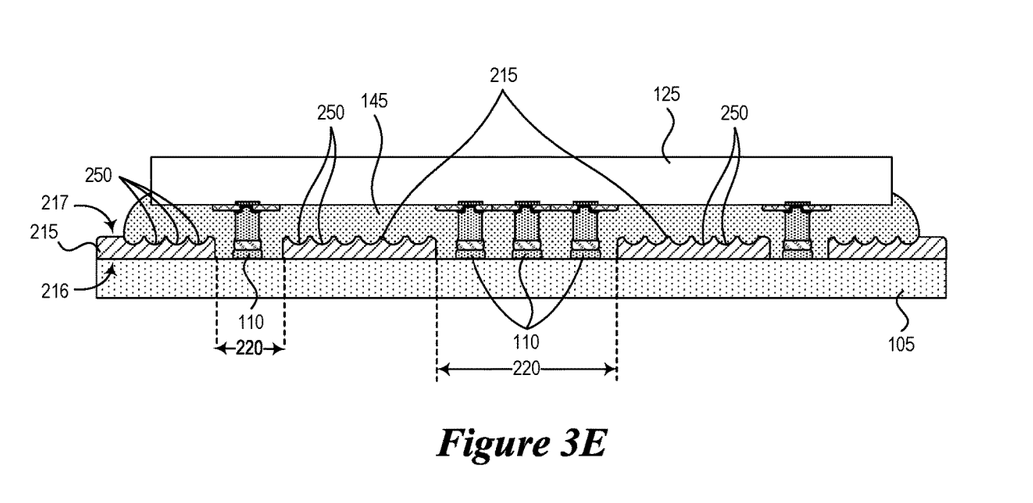

FIG. 3D illustrates a stage of the process after the semiconductor die 125 has been attached to the substrate 105 such that conductive pillars 135 are electrically coupled to the semiconductor die 125 and the conductive bumps 110. In this regard, individual conductive pillars 135 are aligned with corresponding conductive bumps 110 of the substrate 105 such that solder connectors 140 at the end of the conductive pillars 135 bond the conductive pillars 135 to the conductive bumps 110. Subsequently, the fill material 145 is dispensed into the space between the semiconductor die 125 and the substrate 105 to form the semiconductor die assembly 200 depicted in FIG. 3E.

Figure 4A:
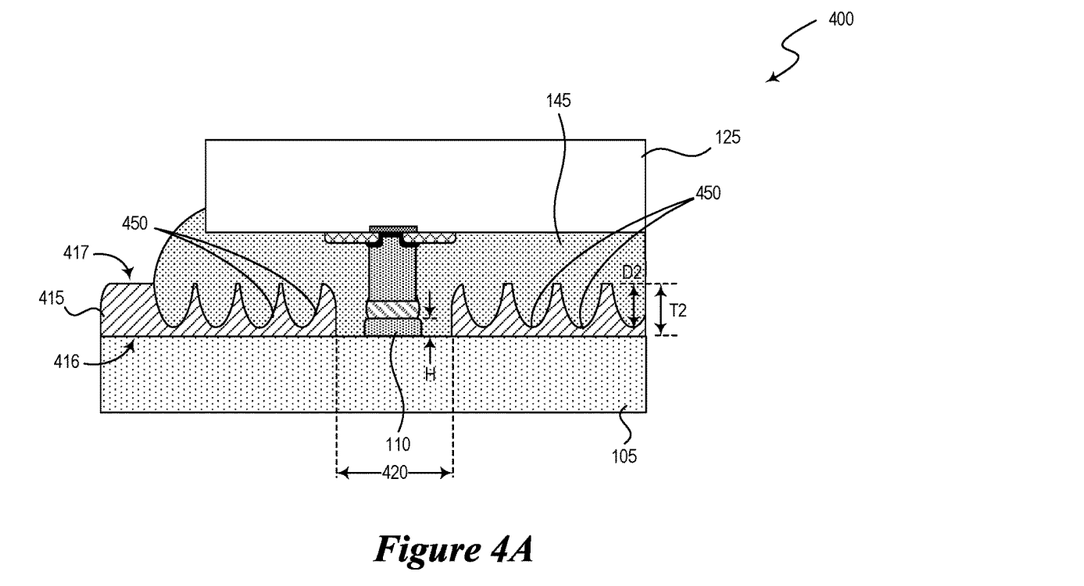
FIG. 4A is a cross-sectional view of a semiconductor device assembly in accordance with an embodiment of the present technology.

FIG. 4A is a cross-sectional view of a semiconductor device assembly 400 in accordance with embodiments of the present technology that includes a solder mask 415. The semiconductor device assembly 400 includes various components described with reference to FIG. 1, such as the substrate 105, the semiconductor die 125 attached to the substrate 105 through interconnects, and the fill material 145 between the substrate 105 and the semiconductor die 125. The solder mask 415 has a first surface 416 attached to the substrate 105 and a second surface 417 opposite to the first surface 416. Further, the solder mask 415 includes openings 420 extending between the first surface 416 and the second surface 417 aligned with areas of the substrate 105 with the conductive bumps 110. The second surface 417 of the solder mask material 415 has non-planar features 450 such that the second surface 417 has an uneven surface profile corresponding to a contour of the non-planar features 450. The non-planar features 450 may be referred to as non-planar surface features.

In some embodiments, the non-planar features 450 may be concave recesses in the second surface 417 of the solder mask material 415. For example, the non-planar features 450 can be scallop-shaped depressions, square-shaped depressions (e.g., castellations), or other shapes. The non-planar features 450 are similar to the non-planar features 250, except that the non-planar features 450 have a depth D2 approximately equal to or greater than a difference between a thickness T2 of the solder mask material 415 and the height H of the conductive bump 110 above the substrate 105. As such, at least one of the non-planar features 450 may extend to the level of the conductive bumps 110. In some embodiments, if the solder masks 215 and 415 have the same thickness, the depth D2 of the non-planar features 450 may be greater than the depth D1 of the non-planar features 250 such that the non-planar features 450 are expected to provide a greater surface area than the non-planar features 250 for increasing adhesion strength. In some embodiments, at least one of the concave recesses has a depth of approximately fifteen micrometers or greater.

Figure 4B:
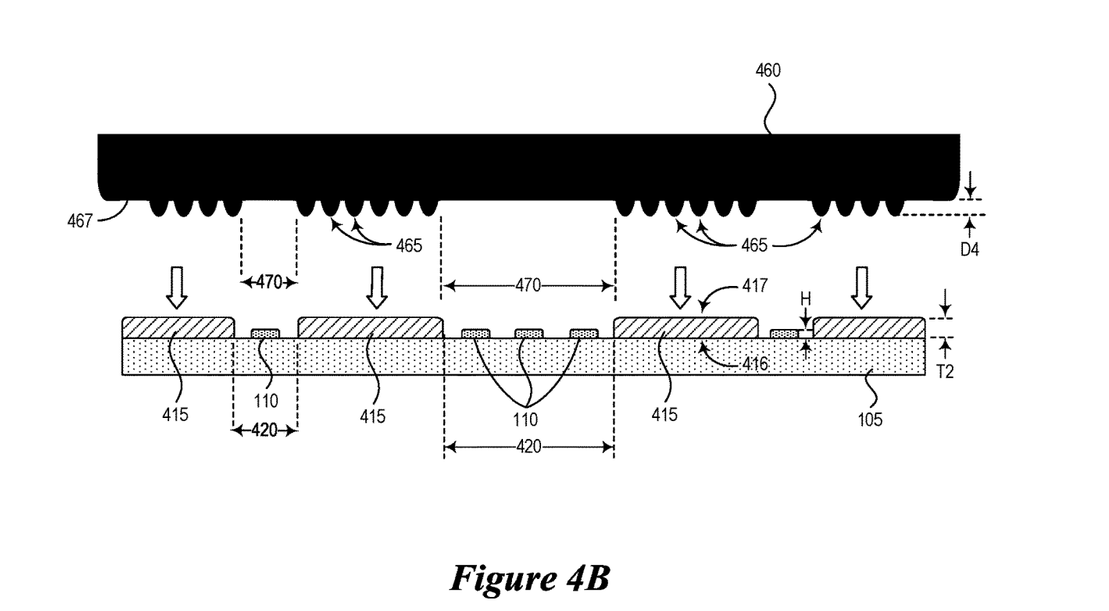
FIG. 4B illustrates one embodiment of forming non-planar surface features on a solder mask of the semiconductor device assembly.

FIG. 4B illustrates one embodiment of forming the non-planar surface features 450 in the second surface 417 of the solder mask material 415 of the semiconductor device assembly 400. At this stage of the process, the second surface 417 is planar. In some embodiments, forming the non-planar surface features 450 includes pressing a mold 460 including convex features 465 against the second surface 417 of the solder mask material 415, as indicated by downward arrows, such that the convex features 465 are at least partially inserted into the solder mask material 415. In some embodiments, the solder mask material 415 may be heated to an elevated temperature while pressing the mold 460 against the solder mask material 415. Subsequently, the mold 460 is lifted from the second surface 417 of the solder mask material 415.

The mold 460 with the convex features 465 forms depressions in the second surface 417 of the solder mask material 415 corresponding to the shape and size of the convex features 465 to construct an embossed solder mask 415. The distance D4 that the convex features 465 protrude from the face 467 of the mold 460 is greater than or equal to the difference between the thickness T2 of the solder mask material 415 and the height H of the conductive bumps 110 above the substrate 105. As such, when the mold 460 is pressed against the second surface 417, the convex features 465 could contact and damage the conductive bumps 110. The mold 460 accordingly does not have convex features 465 in regions 470 above the conductive bumps 110. As a result, the mold 460 includes regions 470 corresponding to the openings 420 of the solder mask 415 without the convex features 465 to avoid damaging the conductive bumps 110. In this regard, the convex features 465 may extend below the height of the conductive bumps 110 during processing. In some embodiments, the distance D4 corresponds to the depth D2 of the non-planar features 450.

Figure 5:
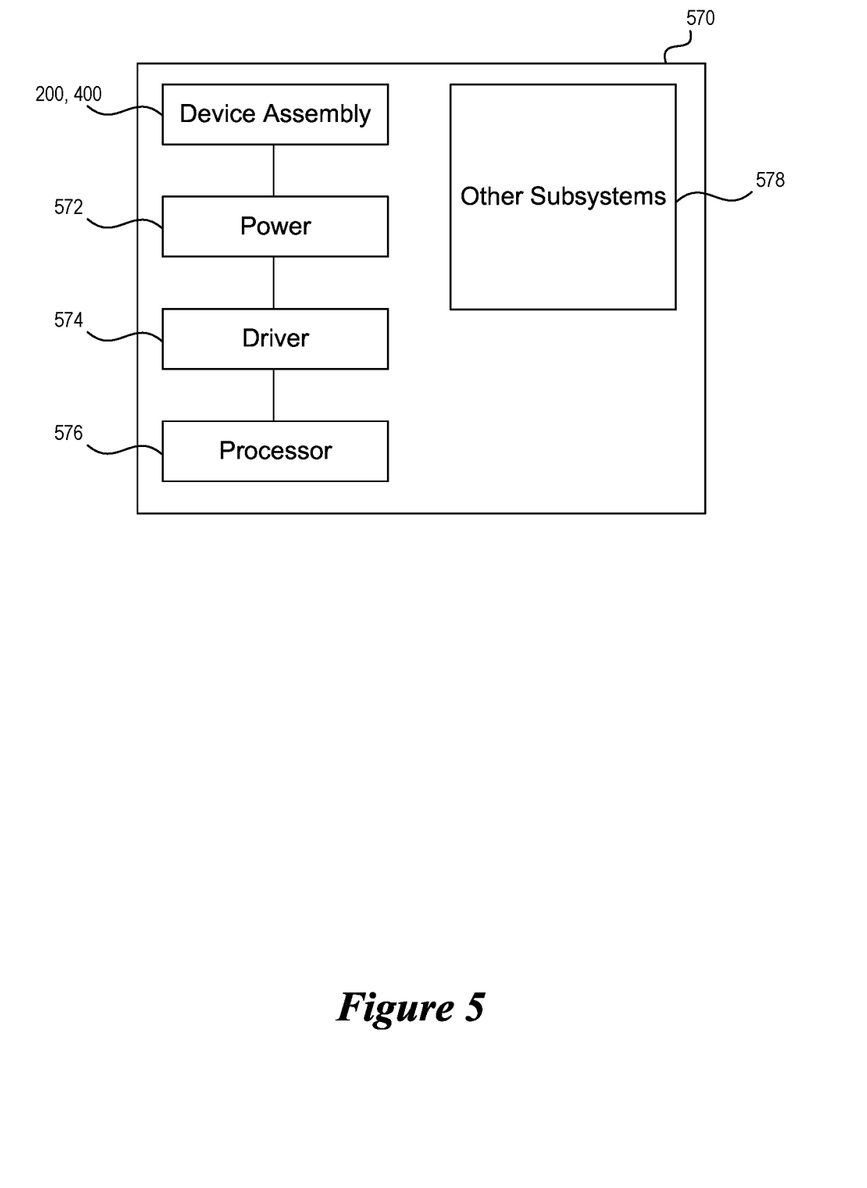
FIG. 5 is a block diagram schematically illustrating a system including a semiconductor device assembly configured in accordance with an embodiment of the present technology.

The semiconductor die assemblies 200, 400 described with reference to FIGS. 2A-4B can be incorporated into any of a myriad of larger and/or more complex systems, a representative example of which is the system 570 shown schematically in FIG. 5. The system 570 can include the semiconductor device assembly 200 or 400, a power source 572, a driver 574, a processor 576, and/or other subsystems or components 578. The semiconductor device assembly 200, 400 can include features generally similar to those of the embossed solder mask described above having an improved adhesion strength between the embossed solder mask and the fill material that mitigates various issues which may limit yield and/or reliability of the semiconductor device assembly 200, 400—e.g., due to delamination between the solder mask and the fill materials and/or cracks rendering the interconnects unreliable or non-functional. The resulting system 570 can perform any of a wide variety of functions, such as memory storage, data processing, and/or other suitable functions. Accordingly, representative systems 570 can include, without limitation, hand-held devices (e.g., mobile phones, tablets, digital readers, and digital audio players), computers, and appliances. Components of the system 570 may be housed in a single unit or distributed over multiple, interconnected units (e.g., through a communications network). The components of the system 570 can also include remote devices and any of a wide variety of computer readable media.

Figure 6:
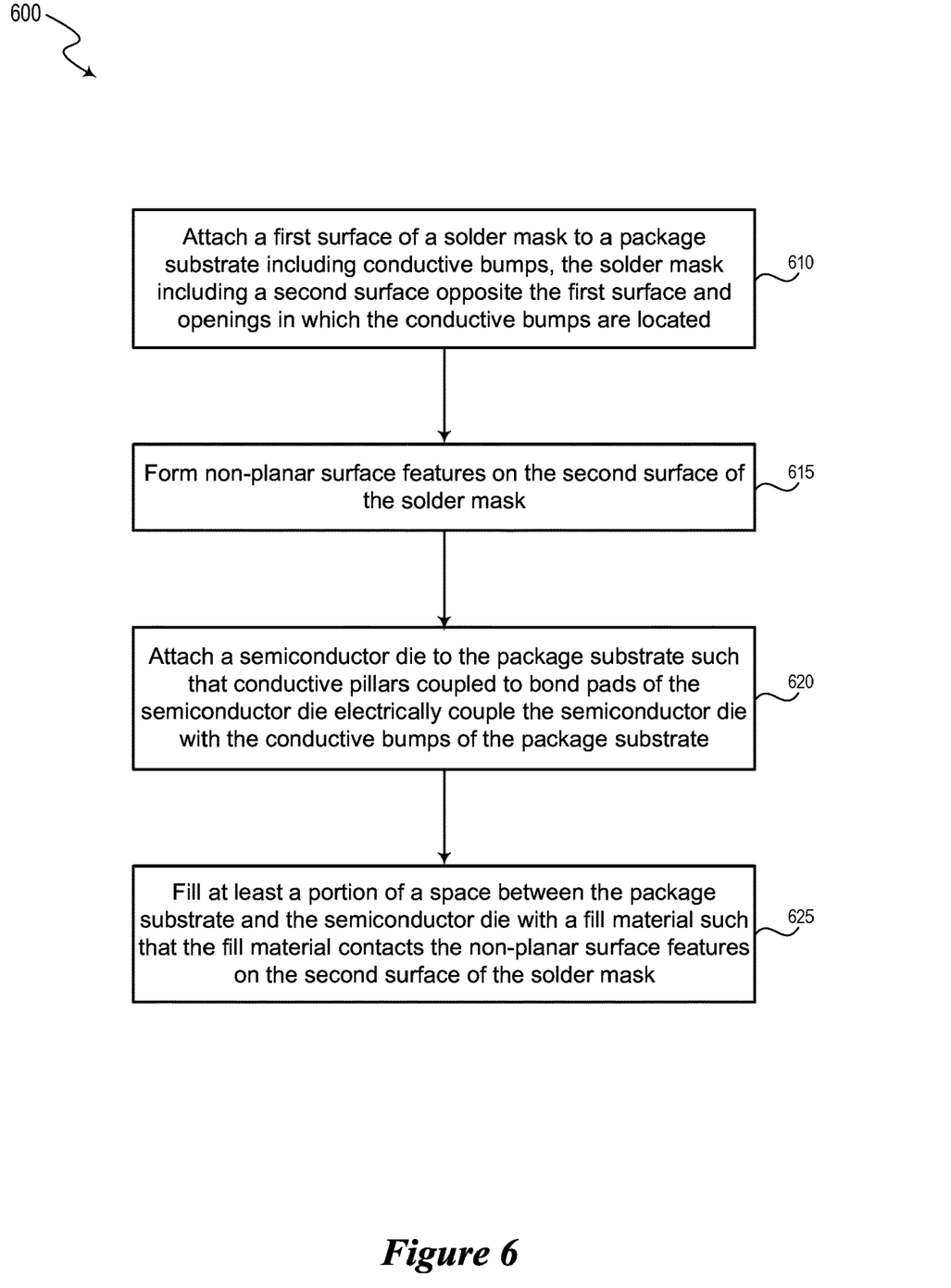
FIG. 6 is a flowchart of a method of forming a semiconductor device assembly in accordance with embodiments of the present technology.

FIG. 6 is a flowchart 600 of a method of forming a semiconductor device assembly (e.g., the semiconductor device assemblies 200 or 400) in accordance with embodiments of the present technology. The flowchart 600 may include aspects of methods as described with reference to FIGS. 3A-4B.

The method includes attaching a first surface of a solder mask to a package substrate including conductive bumps, the solder mask including a second surface opposite the first surface and openings in which the conductive bumps are located (box 610). The method further includes forming non-planar surface features on the second surface of the solder mask (box 615). The method further includes attaching a semiconductor die to the package substrate such that conductive pillars coupled to bond pads of the semiconductor die electrically couple the semiconductor die with the conductive bumps of the package substrate (box 620). The method further includes filling at least a portion of a space between the package substrate and the semiconductor die with a fill material such that the fill material contacts the non-planar surface features on the second surface of the solder mask (box 625).

In some embodiments, an area of the second surface of the solder mask increases as a result of forming the non-planar surface features. In some embodiments, the non-planar surface features include at least one of dimples, depressions, and/or indentations, V-shaped corrugations, brushed grooves, or a combination thereof. In some embodiments, forming the non-planar surface features on the second surface of the solder mask further includes pressing a mold including convex features against the second surface of the solder mask, the convex features at least partially inserted into the solder mask as a result of pressing the mold against the second surface, and lifting the mold from the second surface of the solder mask including the non-planar surface features that each correspond to the convex features.

In some embodiments, the mold lacks the convex features in one or more regions of the mold corresponding to the openings. In some embodiments, at least one of the convex features inserted into the solder mask reaches beyond a height of the conductive bumps. In some embodiments, the method may further include heating the solder mask while pressing the mold against the second surface of the solder mask. In some embodiments, attaching the semiconductor die to the package substrate further includes arranging the semiconductor die such that individual conductive pillars are aligned to the corresponding conductive bumps, wherein an end portion of each conductive pillars includes a conductive bond material having solder. In some embodiments, the method may further include conjoining the individual conductive pillars with the corresponding conductive bumps through the conductive bond material.

It should be noted that the methods described above describe possible implementations, and that the operations and the steps may be rearranged or otherwise modified and that other implementations are possible. Furthermore, embodiments from two or more of the methods may be combined. Further, it will be appreciated that specific embodiments of the technology have been described herein for purposes of illustration, but that various modifications may be made without deviating from the disclosure.

The devices discussed herein, including a semiconductor device, may be formed on a semiconductor substrate or die, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A semiconductor assembly, comprising:
    a package substrate including conductive bumps;
    a solder mask including a first surface attached to the package substrate, a second surface opposite the first surface, openings extending between the first and second surfaces in which the conductive bumps are located, a first plurality of non-planar features along a first region the second surface of the solder mask and a second plurality of non-planar features along a second region of the second surface of the solder mask, wherein the second region is laterally spaced farther away from any of the openings than the first region such that the second region is more susceptible to delamination than the first region;
    a semiconductor die including bond pads, to which conductive pillars are electrically coupled, wherein individual conductive pillars are coupled to corresponding conductive bumps through the openings of the solder mask; and
    a fill material between the semiconductor die and the package substrate,
    wherein the second plurality of non-planar features has a greater average depth than does the first plurality of non-planar features such that an adhesion strength of the fill material at the second plurality of non-planar features is greater than an adhesion strength of the fill material at the first plurality of non-planar features.

2. The semiconductor assembly of claim 1, wherein the first and second pluralities of non-planar features are concave recesses in the second surface of the solder mask.

3. The semiconductor assembly of claim 2, wherein at least one of the concave recesses has a depth of approximately fifteen micrometers or greater.

4. The semiconductor assembly of claim 2, wherein the fill material fills at least one of the concave recesses.

5. The semiconductor assembly of claim 1, wherein the first and second pluralities of non-planar features include at least one of:
    dimples, depressions, and/or indentations;
    V-shaped corrugations;
    brushed grooves; or
    a combination thereof.

6. The semiconductor assembly of claim 1, wherein the conductive pillars and the conductive bumps comprise copper, and the conductive pillars are bonded to the conductive bumps by a conductive bond material comprising solder.

7. A method, comprising:
    attaching a first surface of a solder mask to a package substrate including conductive bumps, the solder mask including a second surface opposite the first surface and openings in which the conductive bumps are located;
    forming a first plurality of non-planar surface features on a first region of the second surface of the solder mask;
    forming a second plurality of non-planar surface features on a second region of the second surface of the solder mask, wherein the second region is laterally spaced farther away from any of the openings than the first region such that the second region is more susceptible to delamination than the first region, and wherein the second plurality of non-planar features has a greater average depth than does the first plurality of non-planar features such that an adhesion strength of the fill material at the second plurality of non-planar features is greater than an adhesion strength of the fill material at the first plurality of non-planar features;
    attaching a semiconductor die to the package substrate such that conductive pillars coupled to bond pads of the semiconductor die electrically couple the semiconductor die with the conductive bumps of the package substrate; and
    filling at least a portion of a space between the package substrate and the semiconductor die with a fill material such that the fill material contacts the first and second pluralities of non-planar surface features on the second surface of the solder mask.

8. The method of claim 7, wherein an area of the second surface of the solder mask increases as a result of forming the first and second pluralities of non-planar surface features.

9. The method of claim 7, wherein the first and second pluralities of non-planar surface features comprise at least one of:
    dimples, depressions, and/or indentations;
    V-shaped corrugations;
    brushed grooves; or
    a combination thereof.

10. The method of claim 7, wherein forming the first and second pluralities of non-planar surface features on the second surface of the solder mask further comprises:
    pressing a mold including convex features against the second surface of the solder mask, the convex features at least partially inserted into the solder mask as a result of pressing the mold against the second surface; and
    lifting the mold from the second surface of the solder mask including the first and second pluralities of non-planar surface features that each correspond to the convex features.

11. The method of claim 10, wherein the mold lacks the convex features in one or more regions of the mold corresponding to the openings.

12. The method of claim 10, wherein at least one of the convex features inserted into the solder mask reaches beyond a height of the conductive bumps.

13. The method of claim 10, further comprising:
heating the solder mask while pressing the mold against the second surface of the solder mask.

14. The method of claim 10, wherein attaching the semiconductor die to the package substrate further comprises:
arranging the semiconductor die such that individual conductive pillars are aligned to the corresponding conductive bumps, wherein an end portion of each conductive pillars includes a conductive bond material having solder.

15. The method of claim 14, further comprising:
conjoining the individual conductive pillars with the corresponding conductive bumps through the conductive bond material.

16. A semiconductor assembly, comprising:
a package substrate including conductive bumps;
a solder mask including a first surface attached to the package substrate, a second surface opposite the first surface, the second surface having a first region with a first uneven surface profile, a second region with a second uneven surface profile with a larger average feature depth than does the first uneven surface profile of the first region, and openings extending between the first and second surfaces in which the conductive bumps are placed, wherein the second region is laterally spaced farther away from any of the openings than the first region such that the second region is more susceptible to delamination than the first region, wherein the larger average feature depth of the second uneven surface profile is effective to produce a greater adhesion strength of the fill material at the second uneven surface profile than an adhesion strength of the fill material at the first uneven surface;
a semiconductor die including bond pads, to which conductive pillars are electrically coupled, wherein individual conductive pillars are coupled to corresponding conductive bumps; and
a fill material in a space between the package substrate and the semiconductor die, wherein a portion of the fill material at least partially fills the first uneven surface profile and the second uneven surface profile of the second surface.

17. The semiconductor assembly of claim 16, wherein the portion of the fill material at least partially filling the first and second uneven surface profiles is a first portion of the fill material, and a second portion of the fill material is in contact with the semiconductor die.

18. The semiconductor assembly of claim 16, wherein the first and second uneven surface profiles correspond to a contour of one or more concave recesses in the second surface of the solder mask.

19. The semiconductor assembly of claim 16, wherein at least a portion of the first or second uneven surface profile of the second surface of the solder mask extends past a height of the conductive bumps.

20. The semiconductor assembly of claim 16, wherein the first and second uneven surface profiles correspond to at least one of:
dimples, depressions, and/or indentations;
V-shaped corrugations;
brushed grooves; or
a combination thereof.

* * * * *